United States Patent
Kim et al.

(10) Patent No.: US 8,604,480 B2
(45) Date of Patent: Dec. 10, 2013

(54) THIN FILM TRANSISTOR ARRAY SUBSTRATE, ORGANIC LIGHT EMITTING DISPLAY DEVICE INCLUDING THE SAME, AND MANUFACTURING METHOD OF THE THIN FILM TRANSISTOR ARRAY SUBSTRATE

(75) Inventors: Kwang-Hae Kim, Yongin (KR); Kwan-Wook Jung, Yongin (KR); Jong-Hyun Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 37 days.

(21) Appl. No.: 13/396,834

(22) Filed: Feb. 15, 2012

(65) Prior Publication Data
US 2013/0032805 A1     Feb. 7, 2013

(30) Foreign Application Priority Data
Aug. 1, 2011 (KR) .......................... 10-2011-0076574

(51) Int. Cl.
*H01L 33/08* (2010.01)
(52) U.S. Cl.
USPC ............................................. 257/59; 438/34
(58) Field of Classification Search
USPC ................. 257/59, 72, 40, E51.018, E33.012
See application file for complete search history.

(56) References Cited

U.S. PATENT DOCUMENTS

| | | | | |
|---|---|---|---|---|
| 6,566,684 B1 * | 5/2003 | Suzawa | ........................... | 257/59 |
| 2003/0047733 A1 * | 3/2003 | Takemura et al. | .............. | 257/59 |
| 2010/0193790 A1 | 8/2010 | Yeo et al. | | |
| 2011/0309363 A1 * | 12/2011 | Misaki | ........................... | 257/59 |

FOREIGN PATENT DOCUMENTS

| KR | 10-2006-0057945 A | 5/2006 |
|---|---|---|
| KR | 10-2009-0120698 A | 11/2009 |
| KR | 10-2010-0088269 | 8/2010 |

* cited by examiner

*Primary Examiner* — Thao P. Le
(74) *Attorney, Agent, or Firm* — Lee & Morse, P.C.

(57) ABSTRACT

A thin film transistor array substrate includes a thin film transistor on a substrate, the thin film transistor including an active layer, a gate electrode, a source electrode, and a drain electrode; a capacitor including a lower electrode in a same layer as the active layer and an upper electrode in a same layer as the gate electrode; a pixel electrode in a same layer as the gate electrode and the upper electrode; a first insulation layer between the active layer and the gate electrode and between the lower electrode and the upper electrode; a second insulation layer on the first insulation layer, a protection layer extending along side surfaces of the lower electrode, and a third insulation layer on the protection layer and exposing the pixel electrode.

29 Claims, 11 Drawing Sheets

THIN FILM TRANSISTOR ARRAY SUBSTRATE, ORGANIC LIGHT EMITTING DISPLAY DEVICE INCLUDING THE SAME, AND MANUFACTURING METHOD OF THE THIN FILM TRANSISTOR ARRAY SUBSTRATE

CROSS-REFERENCE TO RELATED PATENT APPLICATIONS

This application claims the benefit of Korean Patent Application No. 10-2011-0076574, filed on Aug. 1, 2011, in the Korean Intellectual Property Office, the disclosure of which is incorporated herein in its entirety by reference.

BACKGROUND

1. Field

Embodiments relate to a thin film transistor array substrate, an organic light emitting display device including the same, and a manufacturing method of the thin film transistor array substrate.

2. Description of the Related Art

Flat panel display devices such as organic light emitting display devices or liquid crystal display devices include a thin film transistor (TFT), a capacitor, and wiring connecting the parts. In general, a flat panel display device is manufactured on a substrate. To form a fine pattern including a TFT, the pattern is transferred to the substrate by using a mask on which the fine pattern is drawn.

The process of transferring a pattern using a mask generally uses a photolithography process. According to the photolithography process, photoresist is uniformly coated on a substrate on which a pattern is to be formed. The photoresist is exposed to the light by exposure equipment such as a stepper. In case of a positive photoresist, the exposed photoresist is developed. Also, after the photoresist is developed, the pattern is etched using a remaining photoresist as a mask. Then, unnecessary photoresist is removed.

In the process of transferring a pattern using a mask, a mask on which a necessary pattern is formed, is prepared. Thus, manufacturing costs for preparing a mask rise as the number of the processes using a mask increase. Also, since the above-described complicated processes are needed, a manufacturing process is complicated, a manufacturing time increases, and manufacturing costs increase.

SUMMARY

One or more embodiments may provide a thin film transistor on a substrate, the thin film transistor including an active layer, a gate electrode, a source electrode, and a drain electrode; a capacitor including a lower electrode in a same layer as the active layer, and an upper electrode in a same layer as the gate electrode; a pixel electrode in a same layer as the gate electrode and the upper electrode; a first insulation layer between the active layer and the gate electrode and between the lower electrode and the upper electrode; a second insulation layer on top of the first insulation layer; a protection layer extending along side surfaces of the lower electrode; and a third insulation layer on the protection layer and exposing the pixel electrode. The active layer may include a semiconductor material doped with impurities.

The gate electrode may include a first layer including a transparent conductive material and a second layer including metal.

The pixel electrode and the upper electrode may include a transparent conductive material.

The transparent conductive material may include at least one of indium tin oxide (ITO), indium zinc oxide (IZO), zinc oxide (ZnO), indium xide (In$_2$O$_3$), indium gallium oxide (IGO), and aluminum zinc oxide (AZO).

The first insulation layer and the second insulation layer may include an etching surface that is the same. A gap may be between the etching surface and the lower electrode. The protection layer may be in the gap. The protection layer may overlap a portion of the substrate not covered by the first and second insulation layer.

A wiring, connected to the lower electrode at a connection portion, may be disposed in the same layer as the lower electrode, the connection portion extending past a side edge of the first insulation layer.

The wiring and the connection portion of the wiring may include a semiconductor material doped with ion impurities.

The second insulation layer may include a contact hole having an opening larger than the upper electrode. The protection layer may be on upper surfaces of the source electrode, the drain electrode, and the upper electrode. The protection layer may be an inorganic insulation film. The third insulation layer may be an organic insulation film.

A fourth insulation layer may be between the substrate and the first insulation layer.

One or more embodiments may provide an organic light emitting display device including a thin film transistor on a substrate and including an active layer, a gate electrode, a source electrode, and a drain electrode; a capacitor including a lower electrode in a same layer as the active layer and an upper electrode in a same layer as the gate electrode; a pixel electrode in a same layer as the gate electrode and the upper electrode; an organic light emitting layer on the pixel electrode; an opposite electrode on the organic light emitting layer; a first insulation layer between the active layer and the gate electrode and between the lower electrode and the upper electrode, the first insulation layer being spaced from a connection portion of a wiring and the lower electrode; a second insulation layer on top of the first insulation layer, the second insulation layer being spaced from the connection portion of the wiring connected to the lower electrode; a protection layer at the connection portion of the wiring connected to the lower electrode; and a third insulation layer formed on the protection layer and exposing the pixel electrode. The lower electrode and the connection portion of the wiring connected to the lower electrode may include a semiconductor material doped with ion impurities.

The opposite electrode may include a reflection material reflecting light emitted from the light emitting layer.

One or more embodiments may provide a method of manufacturing a thin film transistor array substrate, the method including a first mask process including forming a semiconductor layer on a substrate and forming an active layer of a thin film transistor and a lower electrode of a capacitor by patterning the semiconductor layer, a second mask process including forming a first insulation layer, sequentially depositing a transparent conductive material and first metal on the first insulation layer, and forming a pixel electrode, a gate electrode of the thin film transistor, and an upper electrode of the capacitor, in which the transparent conductive material and the first metal are sequentially deposited, by patterning the transparent conductive material and the first metal; a third mask process including forming a second insulation layer exposing the pixel electrode, a source region and a drain region of the active layer, and the upper electrode, a hole exposing the upper electrode having an opening larger than the upper electrode; a fourth mask process including forming a second metal on a resultant structure of the third mask process, forming a source electrode and a drain electrode connected to the source region and the drain region by patterning the second metal, and removing the first metal on the pixel electrode and the upper electrode; and a fifth mask process including sequentially forming a protection layer and a third insulation layer on a resultant structure of the fourth mask process and removing the protection layer and the third insulation layer from the pixel electrode.

The first mask process including forming a wiring connected to the lower electrode in the same layer as the lower electrode by patterning the semiconductor layer.

After the second mask process, ion impurities may be doped into the source and drain regions and the wiring.

The third mask process including simultaneous etching of the first insulation layer and the second insulation layer. The third mask process including forming a gap between etching surfaces of the first and second insulation layers and the upper electrode.

The fourth mask process may include a first etching process for etching the second metal and a second etching process for removing the first metal from the pixel electrode and the upper electrode. In the fourth mask process, the second metal may be formed of the same material as the first metal, and the first and second metal may be simultaneously etched. After the fourth mask process, ion impurities may be doped into the lower electrode.

In the fifth mask process, the protection layer may be removed after the removal of the third insulation layer. The protection layer may be removed by dry etching.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
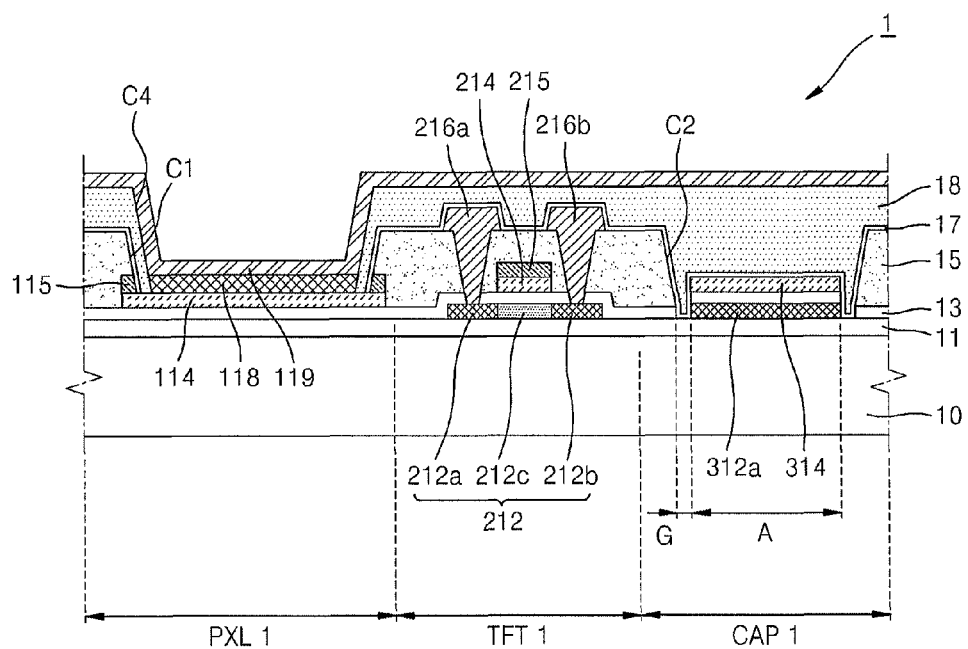
FIG. 1 illustrates a cross-sectional schematic view of an organic light emitting display device according to an embodiment.

Korean Patent Application No. 10-2011-0076574, filed on Aug. 1, 2011, in the Korean Intellectual Property Office, and entitled: "Thin Film Transistor Array Substrate, Organic Light Emitting Display Device Comprising the Same, and Manufacturing Method of The Thin Film Transistor Array Substrate," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional schematic view of an organic light emitting display device 1 according to an embodiment. Referring to FIG. 1, the organic light emitting display device 1 may include a substrate 10 on which a pixel area PXL1 having a light emitting layer 118, a transistor area TFT1 having a thin film transistor, and a capacitor area CAP1 having a capacitor may be formed.

In the transistor area TFT1, an active layer 212 of the thin film transistor may be provided on and above the substrate 10 and a buffer layer 11. The active layer 212 may be formed of semiconductor containing amorphous silicon or polysilicon, and may include a channel region 212c, a source region 212a, and a drain region 212b. The source region 212a and the drain region 212b may be formed outside the channel region 212c and doped with ion impurities.

A gate electrode first layer 214, which may contain a transparent conductive material, and a gate electrode second layer 215, may be sequentially provided above the active layer 212 at a position corresponding to the channel region 212c of the active layer 212, with a first insulation layer 13 interposed therebetween. The first insulation layer 13 may be a gate insulation film. A source electrode 216a and a drain electrode 216b, respectively, may be connected to the source region 212a and the drain region 212b of the active layer 212. The source electrode 216a and the drain electrode 216b may be provided above the gate electrode second layer 215, with a second insulation layer 15 interposed therebetween. The second insulation layer 15 may be an interlayer insulation film.

A protection layer 17 may be provided on the second insulation layer 15 to cover the source electrode 216a and the drain electrode 216b. The protection layer 17 may be provided as an inorganic insulation film. The protection layer 17 may be disposed not only over the source electrode 216a and the drain electrode 216b, but also over a data wiring (not shown) and a power voltage supply wiring (not shown) connected to the same layer as the source electrode 216a and the drain electrode 216b. The protection layer 17 may include at least one inorganic insulation film including one or more of $SiO_2$, SiNx, SiON, $Al_2O_3$, $TiO_2$, $Ta_2O_5$, $HfO_2$, $ZrO_2$, BST, and PZT.

A third insulation layer 18 may be provided on the protection layer 17. The third insulation layer 18 may be provided as an organic insulation film. The third insulation layer 18 may contain general polymer PMMA or PS, a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, or a blend thereof.

In the process of manufacturing the organic light emitting display device 1, the third insulation layer 18 may be formed on the top layer of the substrate 10, prior to a process of forming the light emitting layer 118 on a pixel electrode first layer 114. After the light emitting layer 118 is formed on the pixel electrode first layer 114, an opposite electrode 119, which may be a common electrode, may be formed on the third insulation layer 18.

In the organic light emitting display device 1 according to at least one embodiment, the protection layer 17 may be formed directly on upper surfaces of the source electrode 216a and the drain electrode 216b and the wirings formed in the same layer of the source electrode 216a and the drain electrode 216b. In the event that a pinhole defect is generated in the third insulation layer 18 due to particles, the source electrode 216a and the drain electrode 216b or the wirings formed in the same layer as the source electrode 216a and the drain electrode 216b, which are disposed under the third insulation layer 18, may be protected by the protection layer 17 from direct exposure to the outside. Thus, electric short-circuits which may otherwise be generated between the source electrode 216a and the drain electrode 216b or the wirings and the opposite electrode 119 as a result of the pinhole defect, may be prevented, and generation of defective products may be reduced.

In the pixel area PXL1, according to the present embodiment, the pixel electrode first layer 114 may be formed of the same transparent conductive material as the gate electrode first layer 214. The pixel electrode first layer 114 may be formed on and above the substrate 10, the buffer layer 11, and the first insulation layer 13. The transparent conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

The light emitting layer 118 may be formed on the pixel electrode first layer 114. Light emitted from the light emitting layer 118 may proceed toward the substrate 10 via the pixel electrode first layer 114 that may be formed of the transparent conductive material.

The buffer layer 11 and the first insulation layer 13 may be disposed under the pixel electrode first layer 114. The buffer layer 11 and the first insulation layer 13 may be formed of materials having different reflectance to function as a distributed Bragg reflector (DBR), so that efficiency of light emitted from the light emitting layer 118 may be improved. $SiO_2$ and SiNx may be used for the buffer layer 11 and the first insulation layer 13. Although, as shown in FIG. 1, each of the buffer layer 11 and the first insulation layer 13 may be formed as a single layer, the embodiments are not limited thereto. According to some embodiments, each of the buffer layer 11 and the first insulation layer 13 may be formed as a plurality of layers.

The second insulation layer 15 may be formed outside the pixel electrode second layer 115. A first contact hole C1 for exposing the pixel electrode first layer 114 may be formed in the second insulation layer 15. The protection layer 17 may be formed on an upper surface of the second insulation layer 15. The third insulation layer 18 may be formed on an upper surface of the protection layer 17. An opening C4 for exposing an upper portion of the pixel electrode first layer 114 may be formed in the third insulation layer 18. The light emitting layer 118 may be provided in the opening C4.

The light emitting layer 118 may be a low molecular organic material or a polymer organic material. When the light emitting layer 118 is formed of a low molecular organic material, a hole transport layer (HTL), a hole injection layer (HIL), an electron transport layer (ETL), and an electron injection layer (EIL) may be deposited with respect to the light emitting layer 118. A variety of layers may be additionally deposited as necessary. A usable organic material may be, for example, copper phthalocyanine (CuPc), N'-Di(naphthalene-1-yl)-N, N'-diphenyl-benzidine (NPB), tris-8-hydroxyquinoline aluminum (Alq3), and so forth.

When the light emitting layer 118 is a polymer organic material, the HTL may be additionally deposited with respect to the light emitting layer 118. Poly-(2,4)-ethylene-dihydroxy thiophene (PEDOT) or polyaniline (PANI) may be used as the HTL. Poly-phenylenevinylene (PPV) based and polyfluorene based polymer organic materials may be used as a usable organic material.

The opposite electrode 119 may be deposited on the light emitting layer 118 as a common electrode. In the organic light emitting display device 1 according to the present embodiment, the pixel electrode first layer 114 may be used as an anode and the opposite electrode 119 may be used as a cathode. Alternatively, the polarities of the electrodes may be reversed.

The opposite electrode 119 may be formed to be a reflection electrode including a reflection material. The opposite electrode 119 may include at least one material selected from Al, Mg, Li, Ca, LiF/Ca, and LiF/Al.

As the opposite electrode 119 may be provided as a reflection electrode, the light emitted from the light emitting layer 118 may be reflected from the opposite electrode 119 and proceed toward the substrate 10 by passing through the pixel electrode first layer 114, which may be formed of a transparent conductive material.

In the capacitor area CAP1, on and above the substrate 10 and the buffer layer 11, there may be provided a lower electrode 312a of a capacitor formed of the same material as that of the active layer 212 of the TFT, an upper electrode 314 of the capacitor including a transparent conductive material formed of the same material as that of the pixel electrode first layer 114, and the first insulation layer 13 disposed between the lower electrode 312a and the upper electrode 314.

The lower electrode 312a may include semiconductor doped with ion impurities, which may be the same as that of the source region 212a and the drain region 212b of the active layer 212 of the TFT. When the lower electrode 312a is formed of an intrinsic semiconductor undoped with ion impurity, the capacitor may have a metal oxide semiconductor (MOS) CAP structure with the upper electrode 314. However, when the lower electrode 312a is formed of semiconductor doped with ion impurity, a metal-insulator-metal (MIM) CAP structure having an electrostatic capacity larger than that of the MOS CAP structure may be formed, so that the electrostatic capacity may be maximized. Thus, the MIM CAP structure may realize the same electrostatic capacity with an area smaller than that of the MOS CAP structure, and a margin that may decrease the size of the capacitor increases so that the pixel electrode first layer 114 may be formed to be large and an aperture ratio may, thereby, be increased.

The first insulation layer 13 may be disposed on an upper surface of the lower electrode 312a, but not outside, i.e., not along side surfaces, of the lower electrode 312a. This is because the first insulation layer 13 may be etched together during etching of the second insulation layer 15 that is described below.

The second insulation layer 15 may be provided on an upper surface of the first insulation layer 13 and may include a second contact hole C2 that exposes the upper electrode 314 of the capacitor. The contact hole C2 may have an opening larger than the size of the upper electrode 314. For example, the contact hole may expose upper and side surfaces of the upper electrode 314. Like the first insulation layer 13, described above, the second insulation layer 15 may not be arranged outside, i.e., along side surfaces, of the lower electrode 312a.

The protection layer 17 may be provided on, e.g., only on, an upper surface of the second insulation layer 15. In particular, the protection layer 17 may be disposed on the second insulation layer 15 and outside, i.e., along side surfaces, of the lower electrode 312a, where the first and second insulation layers 13 and 15 are not formed. For example, the protection layer 17 may be formed, e.g., conformally, in an area G, where the first and second insulation layers 13 and 15 are not formed, and along side surfaces of the lower electrode 312a. As such, when the protection layer 17 exists in the area G, where the first and second insulation layers 13 and 15 are not formed, a leakage current, which may be potentially generated between the lower electrode 312a and the upper electrode 314 by a silicon compound formed outside the lower electrode 312a, may be prevented or substantially minimized.

Although it is not illustrated in FIG. 1, the protection layer 17 according to the present embodiment may be formed outside, i.e., along side surfaces, of the lower electrode 312a in the same layer as the lower electrode 312a and on a connection portion of the wiring connected to the lower electrode 312a.

Figure 2:
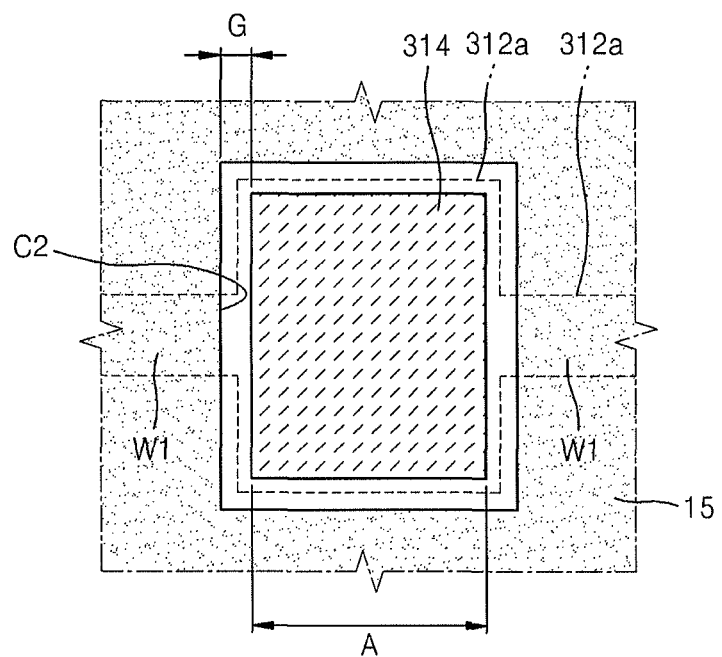
FIG. 2 illustrates a plan schematic view of a capacitor area of the organic light emitting display device.
Figure 3:
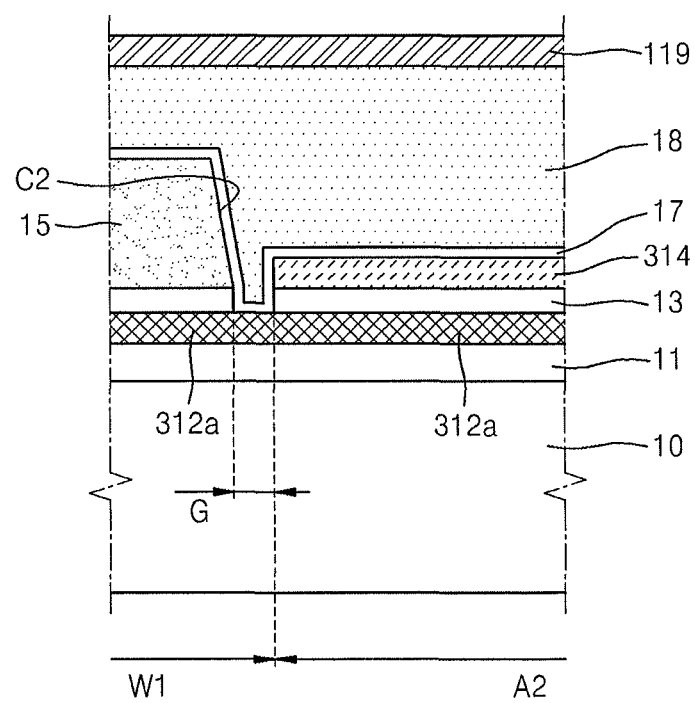
FIG. 3 illustrates a cross-sectional schematic view of the capacitor area.

FIG. 2 illustrates a plan schematic view of a capacitor area of the organic light emitting display device. FIG. 3 illustrates a cross-sectional schematic view of the capacitor area.

Referring to FIGS. 2 and 3, the second contact hole C2, for exposing the whole, e.g., the entire upper surface, of the upper electrode 314 may be formed on the upper surface of the second insulation layer 15. The predetermined gap G where the second insulation layer 15 may not be formed, may be between the outer side edge of the upper electrode 314 and a sidewall of the second contact hole C2.

As described below, the lower electrode 312a and a wiring portion W1 connected to the lower electrode 312a in the same layer may have areas doped with ion impurities that vary according to the size of an area A where the second contact hole C2 formed in the second insulation layer 15 may be formed. If the size of the upper electrode 314 exposed by the second contact hole C2 is smaller than a size of the lower electrode 312a, an area that is undoped, i.e., not doped, with ion impurities may be generated in a semiconductor material at the outside, i.e., outer side surfaces, of the lower electrode 312a and a semiconductor material at the connection portion between the lower electrode 312a and the wiring portion W1. The area that is undoped with ion impurities may have a high resistance value. As such, the capacity of the capacitor may be reduced or signal transmission quality may be deteriorated.

In the present embodiment, however, the second contact hole C2 may have an opening larger than the size of the upper electrode 314. As such, the lower electrode 312a and the wiring portion W1 may all be doped with ion impurities. Thus, since no area of the lower electrode 312a and the wiring portion W1 may be left undoped with ion impurities, the electrostatic capacity may be increased and the signal transmission quality may be improved.

Although in FIGS. 2 and 3, the second contact hole C2 is separated from all edges of the upper electrode 314, the embodiments are not limited thereto. At least a boundary of the second contact hole C2 may be larger than the edge of the lower electrode 312a at a boundary where the lower electrode 312a and the wiring (portion W1) are connected to each other. According to some embodiments, for example, at least an intersection of the lower electrode 312a and the wiring (portion W1) may be in the second contact hole C2.

The gap G may be formed between the outer surface, i.e., side surfaces, of the upper electrode 314 and a sidewall of the second contact hole C2. The protection layer 17 may be provided in the area where the gap G is formed. When no protection layer exists in the gap G where the first and second insulation layers 13 and 15 are not formed, a leakage current may be generated. As such, the protection layer 17 may prevent a leakage current from being generated between the lower electrode 312a and the upper electrode 312 due to a silicon compound formed outside the lower electrode 312a.

The third insulation layer 18 may be provided on the upper surface of the protection layer 17. The third insulation layer 18 may include an organic insulation material having a small permittivity and may be provided between the opposite electrode 19 and the upper electrode 314. As such, parasitic capacitance that may be formed between the opposite electrode 19 and the upper electrode 314 may be reduced, so that signal interference due to the parasitic capacitance may be prevented.

Figure 4:
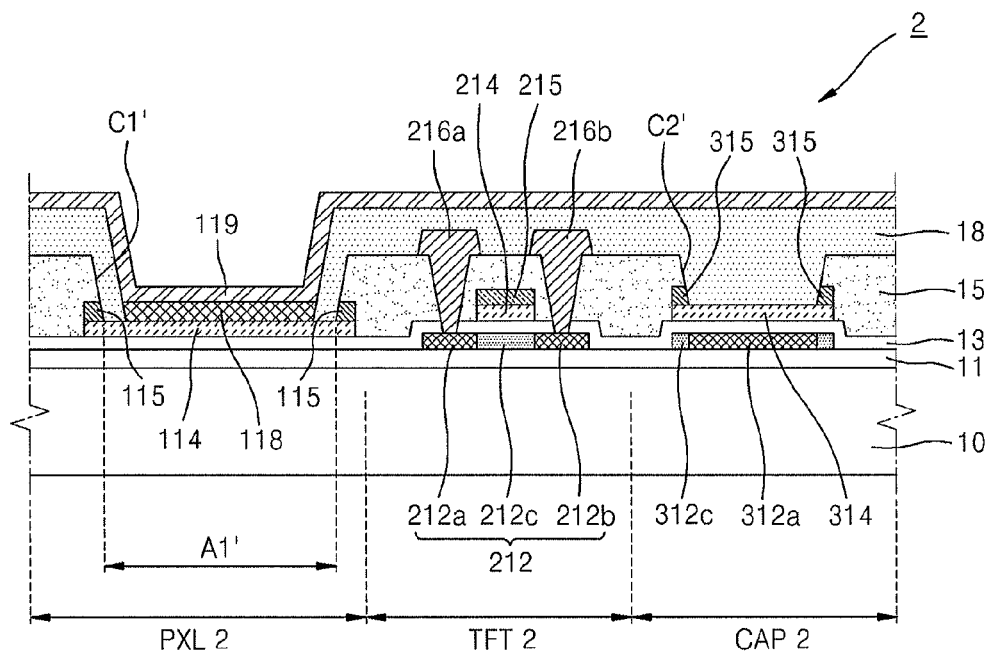
FIG. 4 illustrates a cross-sectional schematic view of an organic light emitting display device according to a comparative example.
Figure 5:
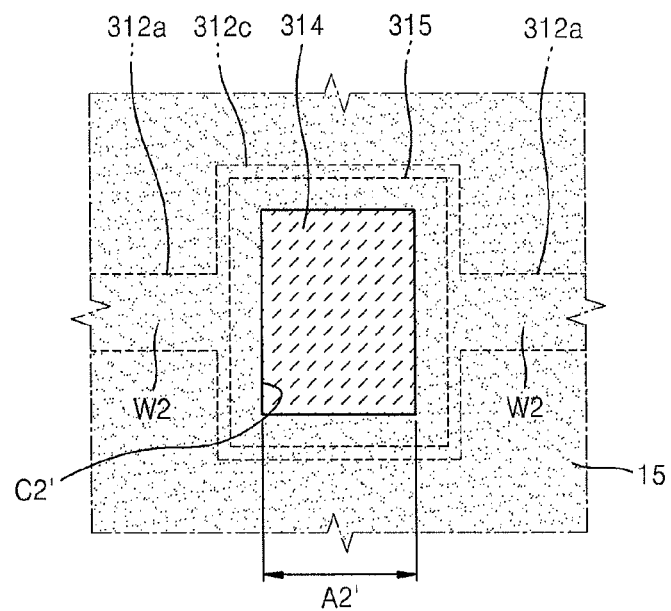
FIG. 5 illustrates a schematic plan view of a capacitor area of the organic light emitting display device.
Figure 6:
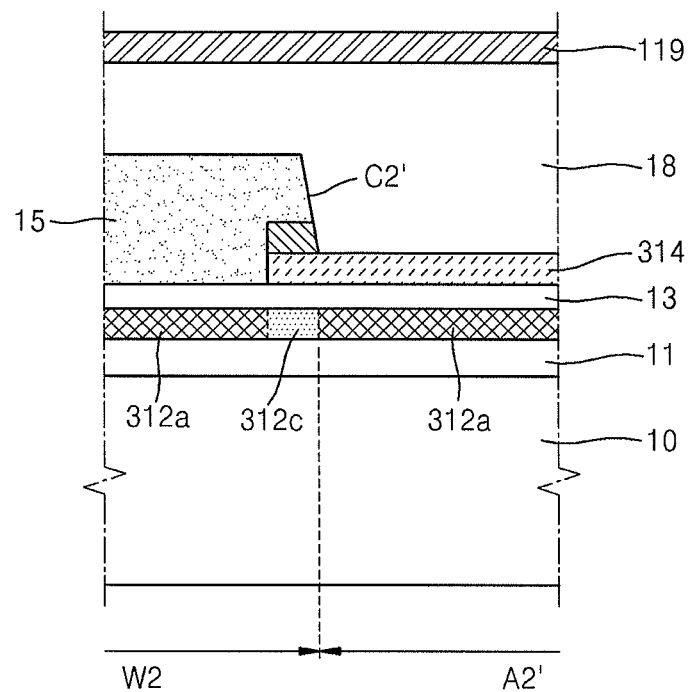
FIG. 6 illustrates a cross-sectional schematic view of the capacitor area of the organic light emitting display device.

FIG. 4 illustrates a cross-sectional schematic view of an organic light emitting display device 2 according to a comparative example. FIG. 5 illustrates a plan schematic view of a capacitor area of the organic light emitting display device 2. FIG. 6 illustrates a cross-sectional schematic view of the capacitor area of the organic light emitting display device 2.

Referring to FIG. 4, a pixel area PXL2 having the light emitting layer 118, a transistor area TFT2 having a thin film transistor, and a capacitor area CAP2 having a capacitor may be formed on the substrate 10 of the organic light emitting display device 2 according to the present comparative example.

The structure of the transistor area TFT2 is the same as that of the transistor area TFT1 according to the above described embodiment, except that the third insulation layer 18 is formed directly on the source electrode 216a and the drain electrode 216b without the protection layer 17.

Accordingly, in the present comparative example, pinhole defects may be generated in the upper portion of the source electrode 216a and the drain electrode 216b and the upper portion of the wiring portion W1 formed in the same layer as the source electrode 216a and the drain electrode 216b. Thus, defects may be generated due to short-circuit among the opposite electrode 119, the source electrode 216a, and the drain electrode 216b.

In the pixel area PXL2, the pixel electrode first layer 114, which is formed of the same transparent conductive material as that of the gate electrode first layer 214, is formed on and above the substrate 10, the buffer layer 11, and the first insulation layer 13. The pixel electrode second layer 115, which is formed of the same metal as that of the gate electrode second layer 215, is formed on the upper outside surface of the pixel electrode first layer 114.

In the capacitor area CAP2, the lower electrode 312a (formed of the same material as that of the active layer 212 of the TFT), the first insulation layer 13 (covering the lower electrode 312a), the upper electrode first layer 314 (including a transparent conductive material and formed of the same material as that of the pixel electrode first layer 114), and an upper electrode second layer 315 (formed of the same material as that of the gate electrode second layer 215), are formed on and above the substrate 10 and the buffer layer 11. The upper electrode second layer 315 is formed at the edge on the upper electrode first layer 314.

In the capacitor area CAP2 according to the present comparative example, the upper electrode second layer 315 is partially left, at the edge of the upper electrode first layer 314, unlike the capacitor area CAP1 according to the above-described embodiment. Thus, the electrostatic capacity of the capacitor areas CAP1 and CAP2 of the above-described embodiment and the present comparative example may vary. Also, the signal transmission quality of the wiring portion W1 connected to the capacitor may vary.

Referring to FIGS. 5 and 6, in the capacitor area CAP2 according to the present comparative example, the upper electrode second layer 315 is left on the upper outer surface of the upper electrode first layer 314. As such, a second contact hole C2' that exposes a part of the upper electrode first layer 314 (not the whole of the upper electrode first layer 314), is formed in the second insulation layer 15. Thus, an area A2' formed by the second contact hole C2' is smaller than the area A formed by the second contact hole C2 of the above-described organic light emitting display device 1. Accordingly, the area doped with ion impurities in the lower electrode 312a may be decreased. Accordingly, electrostatic capacity may decrease as well. In particular, an area 312c that is not ion doped is generated in the connection portion between the wiring portion W1 and the lower electrode 312a, so that the signal transmission quality of a capacitor wiring may be deteriorated.

A method of manufacturing the organic light emitting display device 1 according to the embodiments will be described below with reference to FIGS. 7-15.

Figure 7:
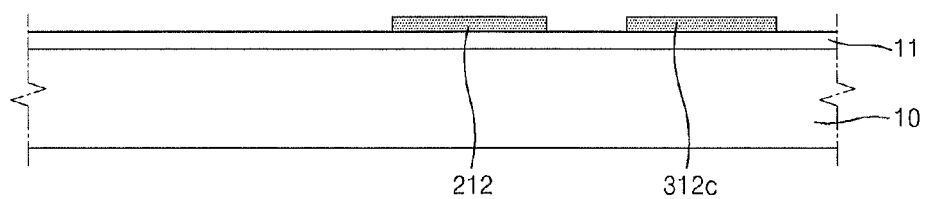
FIG. 7 illustrates a cross-sectional schematic view of a resultant structure of the first mask process of the organic light emitting display device of FIG. 1.

FIG. 7 illustrates a cross-sectional schematic view of a resultant structure of the first mask process of the organic light emitting display device 1 of FIG. 1. Referring to FIG. 7, the active layer 212 of the thin film transistor and a capacitor lower electrode 312c may be formed on the buffer layer 11 that is deposited on the substrate 10. Although it is not illustrated in FIG. 7, during the first mask process, the capacitor wiring portion W1 (See FIG. 9) connected to the capacitor lower electrode 312c may be formed together with the capacitor lower electrode 312c.

The substrate 10 may be formed of a transparent glass material having $SiO_2$ as the main ingredient. The buffer layer 11, including $SiO_2$ and/or SiNx, may be further provided on the substrate 10 to facilitate polarization of the substrate 10 and prevent intrusion of impurity elements.

Although it is not illustrated in FIG. 7, a semiconductor layer (not shown) may be deposited on the buffer layer 11. Photoresist (not shown) may be coated on the semiconductor layer and the semiconductor layer may then be patterned by a photolithography process using a first photomask (not shown). Accordingly, the active layer 212 of the TFT, the capacitor lower electrode 312c and the capacitor wiring portion W1 may be simultaneously formed.

The first mask process by photolithography may be performed by a series of processes, such as developing, etching, and stripping or ashing, after the first photomask is exposed using an exposure equipment (not shown).

The semiconductor layer may be formed of amorphous silicon or polysilicon. The polysilicon may be formed by crystallizing amorphous silicon. The amorphous silicon may be crystallized by a variety of methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

Figure 8:
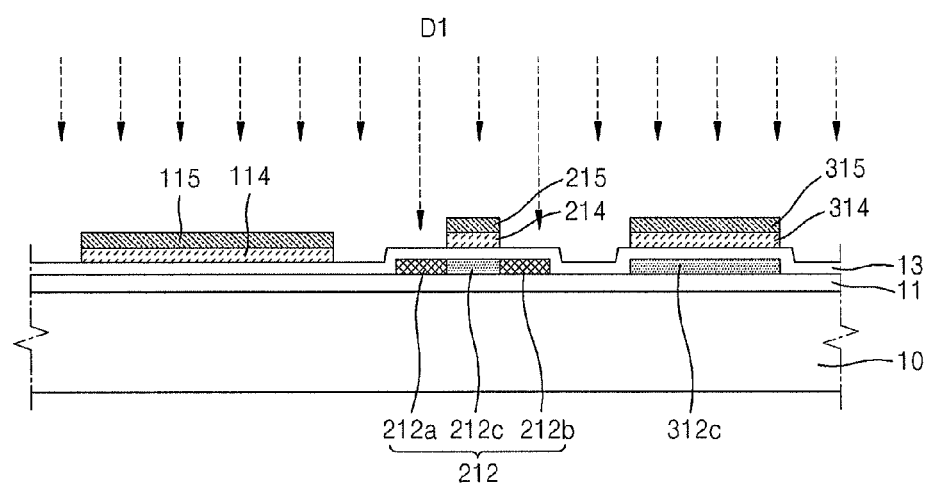
FIG. 8 illustrates a cross-sectional schematic view of a resultant structure of the second mask process of the organic light emitting display device of FIG. 1.

FIG. 8 illustrates a cross-sectional schematic view of a resultant structure of the second mask process of the organic light emitting display device 1 of FIG. 1. Referring to FIG. 8, the first insulation layer 13 may be deposited on a resultant structure of the first mask process of FIG. 7. After a plurality of layers (not shown), including a transparent conductive material and metal, are sequentially deposited on and above the first insulation layer 13, the layers, including a transparent conductive material and metal, may be simultaneously patterned.

As a result of the patterning, the pixel electrode first layer 114, including the transparent conductive material, and the pixel electrode second layer 115, including metal, may be sequentially formed in the pixel area PXL1 on the first insulation layer 13. The gate electrode first layer 214, including the transparent conductive material, and the gate electrode second layer 215, including metal, may be sequentially formed in the transistor area TFT1. The upper electrode first layer 314 of the capacitor, including the transparent conductive material, and the upper electrode second layer 315, including metal, may be simultaneously formed in the capacitor area CAPT1.

As described above, the first insulation layer 13 may include a single layer or multiple layers of $SiO_2$ or SiNx. The first insulation layer 13 may function as a gate insulation film of the thin film transistor and a dielectric film of the capacitor.

The pixel electrode first layer 114, the gate electrode first layer 214, and the upper electrode first layer 314 may be formed of the same transparent conductive material. The pixel electrode second layer 115, the gate electrode second layer 215, and the upper electrode second layer 315 may be formed of the same metal material, for example, at least one material selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), in a single layer or multiple layers.

Ion impurities may be doped over the above structure. The ion impurities may be B or P ions and doped at a concentration of $1 \times 10^{15}$ atoms/cm$^2$ or higher to a target of the active layer 212 of the thin film transistor (D1).

The ion impurities may be doped into the active layer 212 using the gate electrode first and second layers 214 and 215 as a self-align mask. As such, the active layer 212 may include the source and drain regions 212a and 212b doped with the ion impurities and the channel region 212c therebetween. In other words, by using the gate electrode first and second layers 214 and 215 as a self-align mask, the source and drain regions 212a and 212b may be formed without adding a separate photomask.

The upper electrode first and second layers 314 and 315 may function as a shield mask. As such, the capacitor lower electrode 312c may be formed of the same material as that portion of the active layer 212 that is undoped, i.e., not doped, like the channel region 212c. However, the capacitor wiring portion W1, where the upper electrode first and second layers 314 and 315, are not disposed may be doped with the ion impurities.

Figure 9:
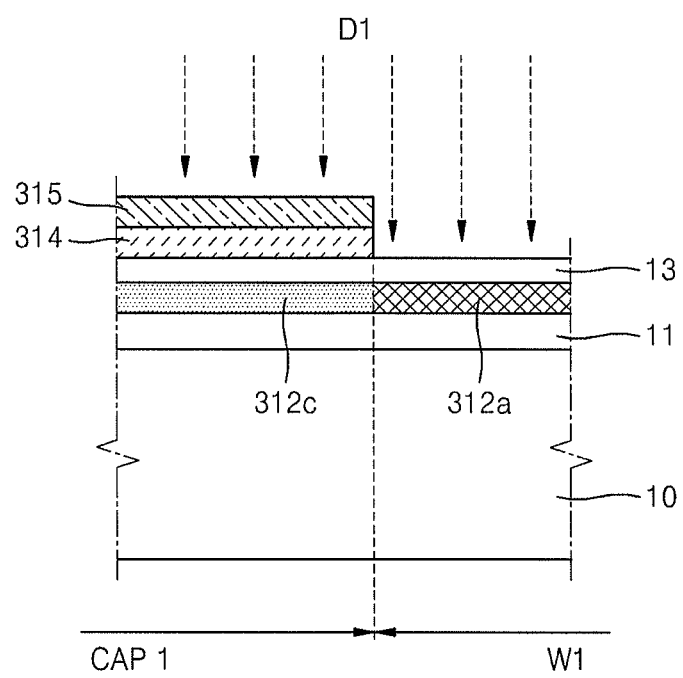
FIG. 9 schematically illustrates a state in which ion impurities are doped in the wiring portion connected to a lower electrode of a capacitor during the first doping process after the second mask process.

FIG. 9 schematically illustrates a state in which ion impurities are doped in the wiring portion W1 connected to the capacitor lower electrode 312c of the capacitor during the first doping process D1 after the second mask process. Referring to FIG. 9, the capacitor lower electrode 312c may be undoped, i.e, not doped, because the capacitor lower electrode 312c may be shielded by the upper electrode first and second layers 314 and 315, whereas the wiring portion W1 may be doped with the ion impurities.

Figure 10:
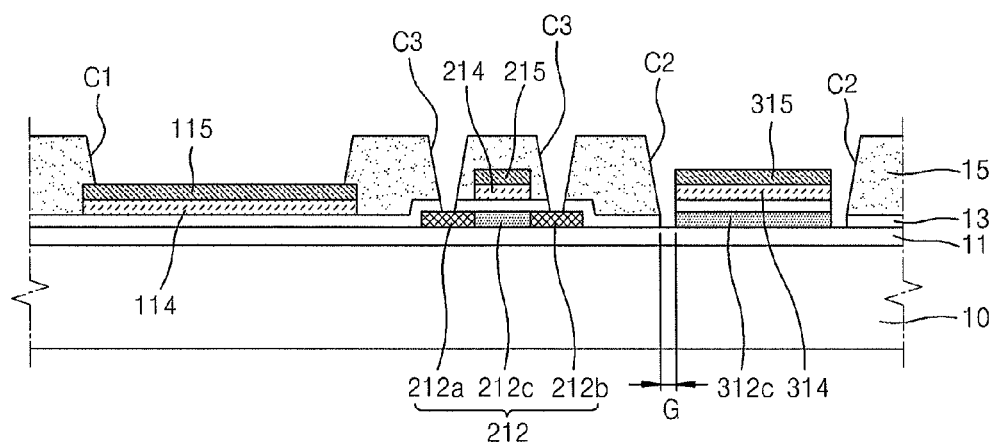
FIG. 10 illustrates a cross-sectional schematic view of a resultant structure of the third mask process of the organic light emitting display device of FIG. 1.

FIG. 10 illustrates a cross-sectional schematic view of a resultant structure of a third mask process of the organic light emitting display device 1 of FIG. 1. Referring to FIG. 10, the second insulation layer 15 may be deposited on a resultant structure of the second mask process of FIG. 8. Then, the first contact hole C1, exposing the pixel electrode second layer 115, the second contact hole C2, exposing the whole of, e.g., side surfaces of, the upper electrode first and second layers 314 and 315, and the third contact hole C3, exposing parts of the source region 212a and the drain region 212b of the active layer 212, may be formed by patterning the second insulation layer 15. The first contact hole C1 may, for example, expose an entire upper surface and side surfaces of the upper electrode second layer 315, and side surfaces of the upper electrode first layer 314.

The first contact hole C1 may expose the pixel electrode second layer 115. Since the second contact hole C2 may expose the whole of, e.g., side surfaces of, the upper electrode first and second layers 314 and 315, the gap G may be formed between the side surfaces of the upper electrode first and second layers 314 and 315 and a sidewall of the second contact hole C2. The third contact hole C3 may partially expose the source region 212a and the drain region 212b. The second insulation layer 15 and the first insulation layer 13 may be etched together.

The first insulation layer 13 may be etched with the second insulation layer 15 in the capacitor area. Thus, the first and second insulation layers 13 and 15 may include the same etch surface. The gap G, where the first and second insulation layers 13 and 15 are not formed, may be formed between the etch surface and the lateral surface of the lower electrode 312a.

Although FIG. 10 illustrates the gap G only in, e.g., through, the first and second insulation layers 13 and 15, the gap G may be formed in the buffer layer 11 under the first insulation layer 13. This is because the buffer layer 11 may also be etched during the etch of the first insulation layer 13.

Figure 11:
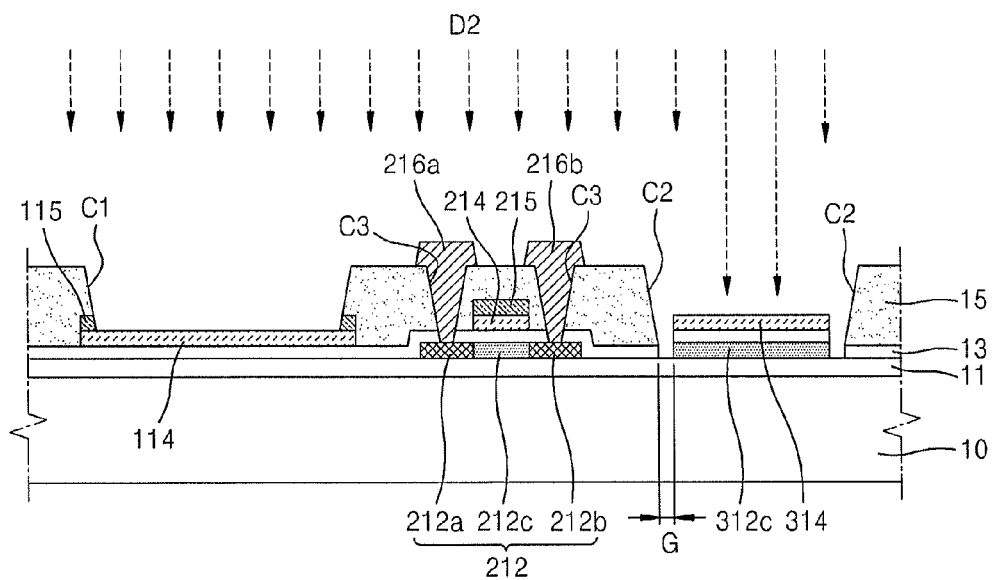
FIG. 11 illustrates a cross-sectional schematic view of a resultant structure of the fourth mask process of the organic light emitting display device of FIG. 1.

FIG. 11 illustrates a cross-sectional schematic view of a resultant structure of a fourth mask process of the organic light emitting display device 1 of FIG. 1. Referring to FIG. 11, the source and drain electrodes 216a and 216b may be formed on the second insulation layer 15. The source and drain electrodes 216a and 216b may be formed of at least one metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), in a single layer or multiple layers.

Although it is not illustrated in detail in FIG. 11, the source and drain electrodes 216a and 216b may be formed by the following process. First, after the metal forming the source and drain electrodes 216a and 216b is deposited on a resultant structure of the third mask process of FIG. 10, patterning may be performed using a fourth photomask (not shown) so as to leave a pattern of the source and drain electrodes 216a and 216b only.

When the metal forming the source and drain electrodes 216a and 216b is the same as the metal forming the pixel electrode second layer 115 and the upper electrode second layer 315, the source and drain electrodes 216a and 216b may be patterned by a one-time etching process using the same etchant. Otherwise, the pattern of the source and drain electrodes 216a and 216b may be formed by etching the metal forming the source and drain electrodes 216a and 216b using a first etchant. Then, the pixel electrode second layer 115 and the upper electrode second layer 315 may be removed using a second etchant.

Ion impurities may be doped over the resultant structure formed after the above-described fourth mask process and etching process. The ion impurities may be B or P ions and doped at an appropriate concentration to a target of the capacitor lower electrode 312c of the capacitor (D2).

Figure 12:
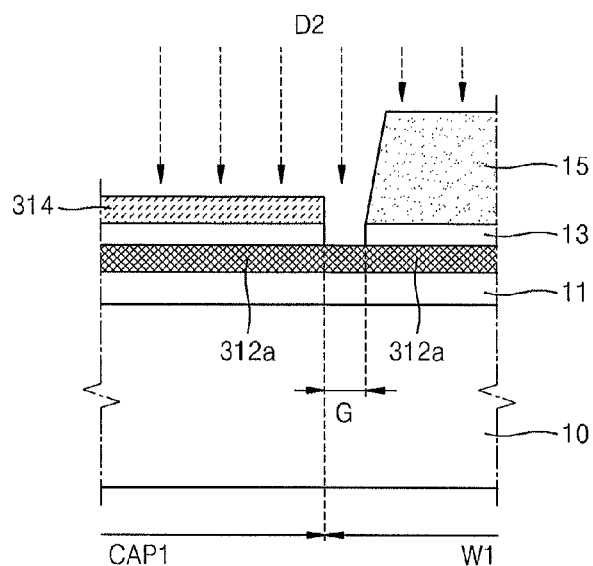
FIG. 12 schematically illustrates a state in which ion impurities are doped in the lower electrode of the capacitor during the second doping process after the fourth mask process.

FIG. 12 schematically illustrates a state in which ion impurities are doped in the lower electrode 312a of the capacitor during the second doping process D2 after the fourth mask process. Referring to FIG. 12, as the lower electrode 312a (See FIG. 9) that is undoped during the first doping D1 is changed to the lower electrode 312a that is doped with the ion impurities after the second doping D2, conductivity of the lower electrode 312a is improved. Accordingly, the capacitor lower electrode 312c, the first insulation layer 13, and the upper electrode first layer 314 may form a MOM CAP structure so that the electrostatic capacity of the capacitor may be improved.

Also, since the second contact hole C2 may be formed in the second insulation layer 15 to be larger than the upper electrode 314, the whole of the upper electrode 314, e.g., upper and side surfaces of the upper electrode 314, side surfaces of the lower electrode 312a, and the wiring portion W1 may all be doped with the ion impurities. Thus, the reduction of the electrostatic capacity may be reduced or the deterioration of the signal transmission quality may be prevented.

Figure 16:
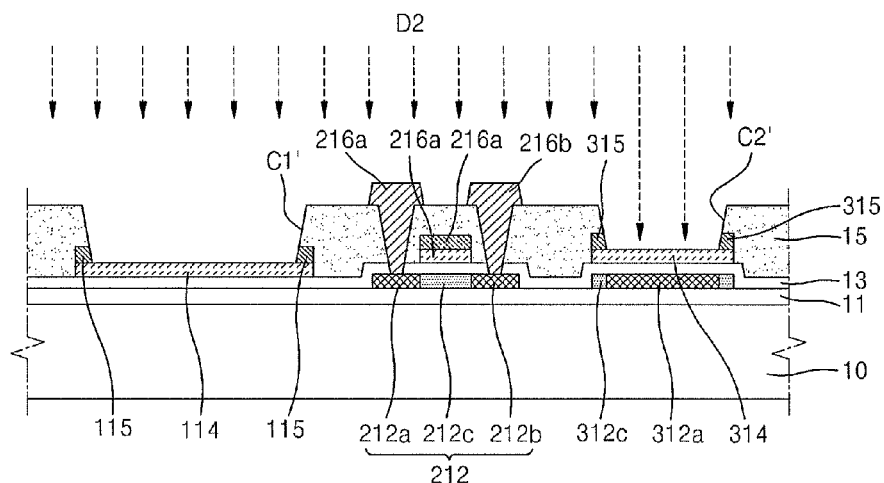
FIGS. 16 and 17 illustrate cross-sectional schematic views of the fourth mask process according to a method of manufacturing the organic light emitting display device of FIG. 4.

FIG. 16 illustrates a schematic cross-sectional view of the fourth mask process as a method of manufacturing the organic light emitting display device of the comparative example of FIG. 4. Referring to FIG. 16, the first and second contact holes C1' and C2' expose not the whole of, but only parts of the pixel electrode first layer 114 and the upper electrode first layer 314, respectively. As a result, parts of the pixel electrode second layer 115 and the upper electrode second layer 315 may be respectively left at the edges of the pixel electrode first layer 114 and the upper electrode first layer 314.

Figure 17:
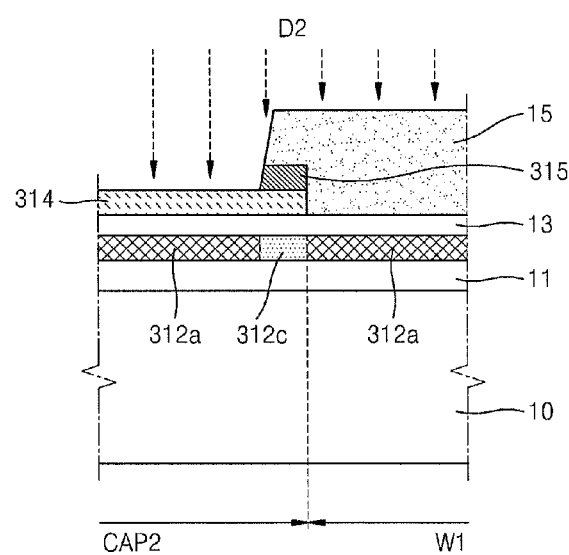

When the above structure is doped with ion impurities, as illustrated in FIG. 17, the lower electrode area 312a that is not shielded by the upper electrode second layer 315 is doped with the ion impurities, whereas a lower area that is shielded by the upper electrode second layer 315 is not doped. The lower area that is undoped is included in the capacitor lower electrode 312c so that the electrostatic capacity of the whole capacitor may be reduced or the signal transmission quality of the wiring portion W1' may be deteriorated.

Figure 13:
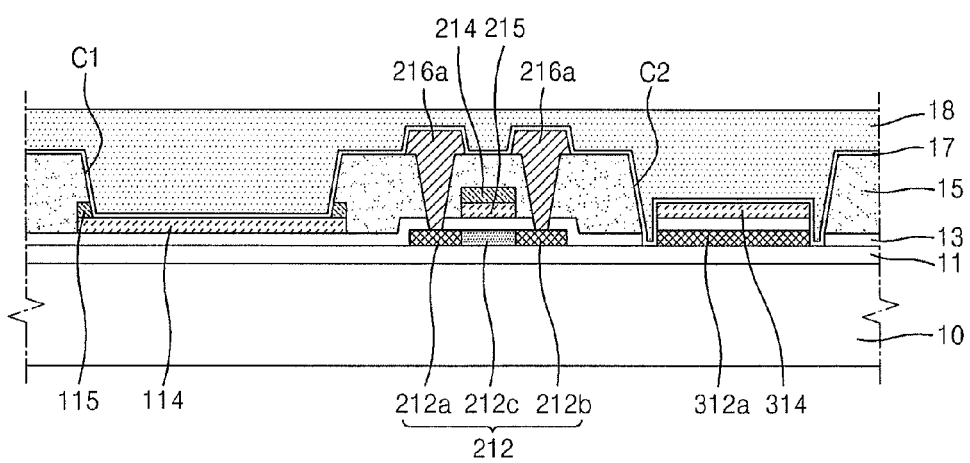
FIGS. 13-15 illustrate cross-sectional schematic views of a resultant structure of the fifth mask process of the organic light emitting display device of FIG. 1.
Figure 14:
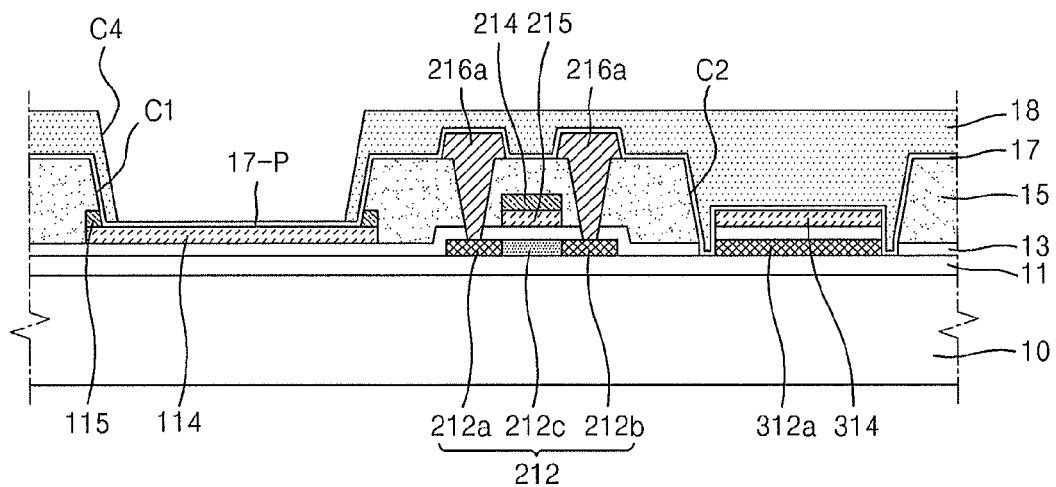
Figure 15:
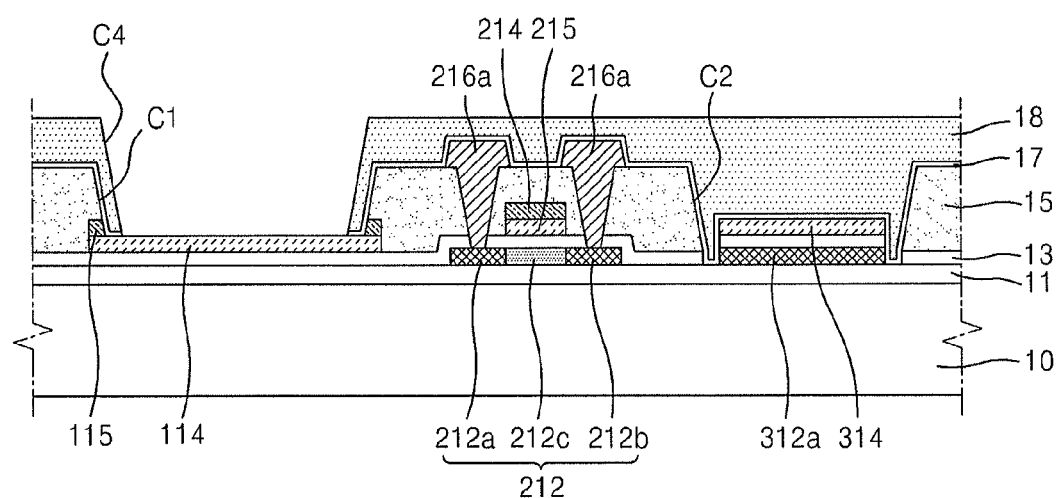

FIGS. 13-15 are cross-sectional views schematically illustrating a resultant structure of a fifth mask process of the organic light emitting display device 1 of FIG. 1. Referring to FIG. 13, the protection layer 17 and the third insulation layer 18 may be sequentially deposited on and above a resultant structure of the fourth mask process of FIG. 11.

In the third mask process of FIG. 11, the metal forming the source and drain electrodes 216a and 216b may be located in the gap G, where the first and second insulation layers 13 and 15 do not exist, prior to the etching process. A part of the metal forming the source and drain electrodes 216a and 216b may contact the lower electrode 312a. A silicon compound, for example, moli-silicide, including the metal may be formed at a contact surface between the metal and the lower electrode 312a.

It should be understood that if a silicon compound including metal is formed, and only the third insulation layer is formed without a protection layer in the capacitor gap G in the fifth mask process, the silicon compound remaining on a contact surface of the gap G may generate a leakage current between the lower electrode 312a and the upper electrode 314 via the third insulation layer 18 that is an organic insulation film. According to the present embodiment, however, by forming the protection layer 17 in the gap G before forming the third insulation layer 18, the leakage current that may be generated between the lower electrode 312a and the upper electrode 314 may be prevented.

Referring to FIG. 14, the opening C4 for exposing the upper surface of the pixel electrode first layer 114 may be formed by patterning the third insulation layer 18. In addition to a function of defining a light emitting area, the opening C4 may have a function of preventing short-circuit between the pixel electrodes 114 and 115 and the opposite electrode 119 by increasing the interval between the edges of the pixel electrode 114 and 115 and the opposite electrode 119 (See FIG. 1), thereby preventing an electric field from being concentrated on the edges of the pixel electrodes 114 and 115. Since the size of the opening C4 increases with the size of the first contact hole C1 formed in the second insulation layer 15, as described above, the light emitting layer 118 (See FIG. 1) may be formed relatively wider in the opening C4 that is widened, so that the light emitting area expands and thus an aperture ratio may be increased.

When the protection layer 17 is formed of an inorganic insulation film and the third insulation layer 18 is formed of an organic insulation film, as illustrated in FIG. 14, the third insulation layer 18 may first be removed by wet etching by a photolithography process.

Referring to FIG. 15, the protection layer 17, disposed on the pixel electrode first layer 114, may be removed by dry etching.

Figure 18:
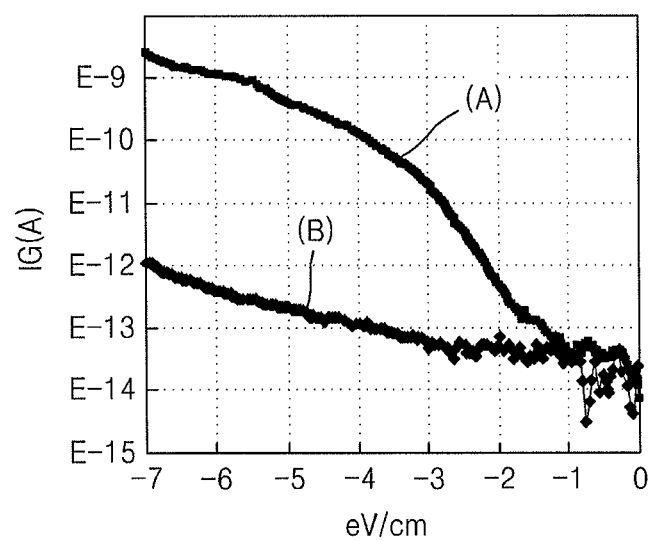
FIG. 18 illustrates a graph showing the relation between a current-voltage property and the existence of a protection layer on a connection portion between the wiring portion and the lower electrode.

FIG. 18 illustrates a graph showing the relation between a current-voltage property and the existence of the protection layer 17 on the connection portion between the wiring portion W1 and the lower electrode 312a. Referring to FIG. 18, a graph A indicates a current-voltage property when the protection layer 17 is not provided on the connection portion between the wiring portion W1 and the lower electrode 312a. A graph B indicates a current-voltage property when the protection layer 17 is provided on the connection portion between the wiring portion W1 and the lower electrode 312a. In the graph of FIG. 18, the horizontal axis denotes an applied voltage MV/cm and the vertical axis denotes a gate current A. It may be seen from the graph of FIG. 18 that the current-voltage property of the graph A is improved compared to the graph B.

Thus, according to the organic light emitting display device and the manufacturing method thereof according to the embodiments, since the protection layer is formed in the area G where the first and second insulation layers 13 and 15 are not formed and outside the lower electrode 312a, the generation of a leakage current between the lower electrode 312a and the upper electrode 312 may be prevented.

As described above, a thin film transistor array substrate according to the embodiments, an organic light emitting display device including the thin film transistor array substrate, and a manufacturing method of the thin film transistor array substrate have the following effects.

First, ion impurities may be doped in the lower electrode of the capacitor and the wiring portion, so that electrostatic capacity may be improved and signal transmission quality of the capacitor wiring may be improved.

Second, the protection film may be formed in an area at the outer edge, e.g. side edge, of the lower electrode, where the insulation layer is not formed, so that leakage current may be prevented between the lower electrode and the upper electrode.

Third, an MIM CAP structure exhibiting superior electrostatic capacity may be provided.

Fourth, the above-described organic light emitting display device may be manufactured through the mask process.

One or more embodiments may provide a thin film transistor array substrate, which may be manufactured by a simple manufacturing process and may exhibit superior signal transmission, an organic light emitting display device comprising the same, and a manufacturing method of the thin film transistor array substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A thin film transistor array substrate, comprising:
a thin film transistor on a substrate, the thin film transistor including an active layer, a gate electrode, a source electrode, and a drain electrode;
a capacitor including a lower electrode in a same layer as the active layer, and an upper electrode in a same layer as the gate electrode;
a pixel electrode in a same layer as the gate electrode and the upper electrode;
a first insulation layer between the active layer and the gate electrode and between the lower electrode and the upper electrode;
a second insulation layer on the first insulation layer;
a protection layer extending along side surfaces of the lower electrode; and
a third insulation layer on the protection layer and exposing the pixel electrode.
2. The thin film transistor array substrate as claimed in claim 1, wherein the active layer includes a semiconductor material doped with impurities.

3. The thin film transistor array substrate as claimed in claim 1, wherein the gate electrode includes:
   a first layer including a transparent conductive material; and
   a second layer including metal.

4. The thin film transistor array substrate as claimed in claim 1, wherein the pixel electrode and the upper electrode include a transparent conductive material.

5. The thin film transistor array substrate as claimed in claim 4, wherein the transparent conductive material includes at least one of indium tin oxide (ITO), indium zinc oxide (IZO), zinc oxide (ZnO), indium oxide ($In_2O_3$), indium gallium oxide (IGO), and aluminum zinc oxide (AZO).

6. The thin film transistor array substrate as claimed in claim 1, wherein the first insulation layer and the second insulation layer include an etching surface that is the same.

7. The thin film transistor array substrate as claimed in claim 6, further comprising a gap between the etching surface and the lower electrode.

8. The thin film transistor array substrate as claimed in claim 7, wherein the protection layer is in the gap.

9. The thin film transistor array substrate as claimed in claim 1, wherein the protection layer overlaps a portion of the substrate not covered by the first and second insulation layer.

10. The thin film transistor array substrate as claimed in claim 1, wherein a wiring, connected to the lower electrode at a connection portion, is disposed in the same layer as the lower electrode, the connection portion extending past a side edge of the first insulation layer.

11. The thin film transistor array substrate as claimed in claim 10, wherein the wiring and the connection portion of the wiring include a semiconductor material doped with ion impurities.

12. The thin film transistor array substrate as claimed in claim 1, wherein the second insulation layer includes a contact hole having an opening larger than the upper electrode.

13. The thin film transistor array substrate as claimed in claim 1, wherein the protection layer is on upper surfaces of the source electrode, the drain electrode, and the upper electrode.

14. The thin film transistor array substrate as claimed in claim 1, wherein the protection layer is an inorganic insulation film.

15. The thin film transistor array substrate as claimed in claim 1, wherein the third insulation layer is an organic insulation film.

16. The thin film transistor array substrate as claimed in claim 1, further comprising a fourth insulation layer between the substrate and the first insulation layer.

17. An organic light emitting display device comprising:
   a thin film transistor on a substrate and including an active layer, a gate electrode, a source electrode, and a drain electrode;
   a capacitor including a lower electrode in a same layer as the active layer and an upper electrode in a same layer as the gate electrode;
   a pixel electrode in a same layer as the gate electrode and the upper electrode;
   an organic light emitting layer on the pixel electrode;
   an opposite electrode on the organic light emitting layer;
   a first insulation layer between the active layer and the gate electrode and between the lower electrode and the upper electrode, the first insulation layer being spaced from a connection portion of a wiring and the lower electrode;
   a second insulation layer on top of the first insulation layer, the second insulation layer being spaced from the connection portion of the wiring connected to the lower electrode;
   a protection layer at the connection portion of the wiring connected to the lower electrode; and
   a third insulation layer formed on the protection layer and exposing the pixel electrode.

18. The organic light emitting display device as claimed in claim 17, wherein the lower electrode and the connection portion of the wiring connected to the lower electrode include a semiconductor material doped with ion impurities.

19. The organic light emitting display device as claimed in claim 17, wherein the opposite electrode includes a reflection material reflecting light emitted from the light emitting layer.

20. A method of manufacturing a thin film transistor array substrate, the method comprising:
   a first mask process including forming a semiconductor layer on a substrate, and forming an active layer of a thin film transistor and a lower electrode of a capacitor by patterning the semiconductor layer;
   a second mask process including forming a first insulation layer, sequentially depositing a transparent conductive material and first metal on the first insulation layer, and forming a pixel electrode, a gate electrode of the thin film transistor, and an upper electrode of the capacitor, in which the transparent conductive material and the first metal are sequentially deposited, by patterning the transparent conductive material and the first metal;
   a third mask process including forming a second insulation layer exposing the pixel electrode, a source region and a drain region of the active layer, and the upper electrode, a hole exposing the upper electrode having an opening larger than the upper electrode;
   a fourth mask process including forming a second metal on a resultant structure of the third mask process, forming a source electrode and a drain electrode connected to the source region and the drain region by patterning the second metal, and removing the first metal on the pixel electrode and the upper electrode; and
   a fifth mask process including sequentially forming a protection layer and a third insulation layer on a resultant structure of the fourth mask process and removing the protection layer and the third insulation layer from the pixel electrode.

21. The method as claimed in claim 20, wherein the first mask process further includes forming a wiring connected to the lower electrode in the same layer as the lower electrode by patterning the semiconductor layer.

22. The method as claimed in claim 20, further comprising doping ion impurities into the source and drain regions and the wiring after the second mask process.

23. The method as claimed in claim 20, further comprising simultaneous etching of the first insulation layer and the second insulation layer in the third mask process.

24. The method as claimed in claim 23, further including forming a gap between etching surfaces of the first and second insulation layers and the upper electrode in the third mask process.

25. The method as claimed in claim 20, wherein the fourth mask process includes:
   a first etching process for etching the second metal; and
   a second etching process for removing the first metal from the pixel electrode and the upper electrode.

26. The method as claimed in claim 20, further comprising forming the second metal of the same material as the first metal, and simultaneously etching the first and second metal in the fourth mask process.

27. The method as claimed in claim 20, further comprising doping ion impurities into the lower electrode after the fourth mask process.

28. The method as claimed in claim 20, further comprising removing the protection layer after the removal of the third insulation layer in the fifth mask process.

29. The method as claimed in claim 28, wherein the protection layer is removed by dry etching.

* * * * *